United States Patent [19]

Hartmann et al.

[11] 3,886,504

[45] May 27, 1975

[54] ACOUSTIC SURFACE WAVE RESONATOR DEVICES

[75] Inventors: Clinto Sylvester Hartmann; Ronald Carl Rosenfeld, both of Richardson, Tex.

[73] Assignee: Texas Instruments Incorporated, Dallas, Tex.

[22] Filed: May 20, 1974

[21] Appl. No.: 471,616

[52] U.S. Cl. ...................... 333/72; 310/8.2; 310/9.8

[51] Int. Cl......... H03h 9/26; H03h 9/30; H01v 7/00

[58] Field of Search ......... 333/30 R, 72; 310/8, 8.1, 310/8.2, 9.7, 9.8

[56] References Cited

UNITED STATES PATENTS

| | | | |
|---|---|---|---|
| 3,716,809 | 2/1973 | Reeder et al. | 333/30 R X |
| 3,836,876 | 9/1974 | Marshall et al. | 333/30 R R |

*Primary Examiner*—James W. Lawrence
*Assistant Examiner*—Marvin Nussbaum
*Attorney, Agent, or Firm*—Harold Levine; James T. Comfort; William E. Hiller

[57] ABSTRACT

This disclosure concerns acoustic surface wave resonator devices having particular applicability as band-pass filters and oscillator frequency control elements at VHF and UHF frequency ranges. In a basic form of the acoustic surface wave resonator device, first and second grating structures are arranged in spaced aligned relationship on a substrate of piezoelectric material with an interdigitated acoustic surface wave transducer interposed therebetween. The grating structures provide plural edge reflectors on opposite sides of the surface wave transducer and are so positioned in relation thereto to set up a standing wave resonance condition with a controlled bandwidth from the reflection of acoustic signals generated by the transducer. In another form, input and output acoustic surface wave transducers are interposed between first and second grating structures, wherein the output transducer couples electrical energy out of the resonator device. Either acoustic or electrical coupling may also be introduced between the input and output transducers to further improve signal transmission.

20 Claims, 6 Drawing Figures

ACOUSTIC SURFACE WAVE RESONATOR DEVICES

This invention relates to acoustic surface wave resonator devices and more particularly to bandpass filters and oscillator frequency control elements at VHF or UHF frequency ranges employing such resonator structures.

There is frequently a requirement in communications and other electronic equipment for filters possessing a very narrow frequency response, i.e., bandpass filters or oscillator frequency control elements. Depending on the specific requirements and the frequency range under consideration, there are available various approaches to the meeting of this requirement. One approach frequently used is the use of a crystal resonator employing a quartz crystal. Unfortunately, the size of crystal resonators for use in the VHF and UHF bands is such that fabrication becomes extremely difficult.

The recent advent of surface wave delay line devices presents an attractive new approach to the solution of filtering problems in the VHF and UHF bands. Briefly, these devices consist first of a substrate of piezoelectric material such as quartz, lithium niobate, zinc oxide or cadmium sulfide, or thin films of piezoelectric materials on nonpiezoelectric substrates such as zinc oxide on silicon. Formed thereon, is an input transducer for the purpose of converting input electrical energy to acoustical energy within the substrate. This acoustical energy propagates down the substrate to the area of a second output transducer which performs the function of converting the acoustical energy to an electric output signal. The input and output transducers frequently comprise interdigital transducers well-known to those skilled in the art. Interdigital transducers are formed by depositing thin films of electrically conductive material such as aluminum or gold and patterning the thin film into an appropriate structure. Electrical potentials coupled to the input interdigital transducers induce mechanical stresses in the piezoelectric substrate. The resultant strains propagate along the surface of the substrate away from the input interdigital transducer in the form of surface waves, such as, the well-known Rayleigh waves or Love waves. These propagating strains arrive at a second output interdigital transducer whereby they are converted to output electrical signals. A frequency response characteristic is associated with either the conversion of electrical to acoustic energy by the input interdigital transducer or with the conversion of acoustical to electrical energy by the output interdigital transducer. The nature of these frequency response characteristics is determined by the specific configuration of the transducers themselves. Thus, it is possible to configure the frequency response of the overall device by proper design of the input and output interdigital transducers. In particular with reference to the present invention, it is possible to design the surface wave delay line device to function as a narrow bandpass filter.

To a first approximation, it may be said that the bandwidth of the resultant bandpass filter is inversely proportional to the length of one or both of the interdigital transducers. In theory, at least, it appears possible to make the bandpass as narrow as desired by appropriately increasing the length of the interdigital transducers. One of the advantages of surface wave delay line devices, however, stems from the fact that sophisticated frequency responses are achievable with structures that are very small in volume. Expansion of the extent of the interdigital transducers and the consequent required increase in size of the overall device in order to achieve a desired frequency response tends to defeat this advantage. It is desirable therefore to provide the capability for increasing the frequency selectivity of the device while retaining its advantageous small size.

It has been recognized that if the surface waves are allowed to propagate past the output transducer to the extremity of the substrate there will result edge reflections with consequent propagation of the reflected energy back toward the input transducer. Similarly, energy propagating past the input transducer to the other extremity of the substrate will also result in edge reflections. If the reflection coefficients of these edge reflections are sufficiently high, there exists the possibility of establishing standing wave patterns within the substrate. In other words, the surface wave delay line device may function as a high Q resonator analogous to the quartz crystal resonators. Unfortunately, boundary reflections of surface waves constitute an extremely complex process. Not only is there reflection of the surface wave itself but there occurs significant conversion of the surface wave to other modes of propagation, such as bulk waves. This circumstance makes proper design and control of such a device extremely difficult. Moreover, establishing the desired resonance pattern requires very precise loaction of the edges of the substrate material, a feature very difficult to achieve in a manufacturing environment. Thus, while the establishing of a resonating structure is an attractive approach to the the realization of highly selective bandpass filters the use of edge reflections as a means of accomplishing this does not appear feasible Another way of providing the desired reflections is through the use of grating structure placed at an appropriate location on the surface of the substrate itself. This possibility is suggested by E. A. Ash in an abstract of a paper entitled "Surface Wave Grating Reflectors and Resonators" presented at the 1970 International Microwave Symposium, May 11–14, 1970, Newport Beach, Calif. However, efforts to achieve a practical resonator employing two spaced gratings have not met with any substantial degree of success heretofore, as evidenced by the unsatisfactorily low Q value of 80 purportedly attained by the device described in the Ash article.

In accordance with the present invention, it is proposed to provide an acoustic surface wave resonator device employing two spaced grating structures on a piezoelectric substrate or a piezoelectric film disposed on a substrate, wherein at least on acoustic surface wave transducer is interposed between the grating structures for generating acoustic surface waves in the piezoelectric material in response to electrical excitation and with the grating structures being so positioned in relation to the opposite sides of the transducer to set up a standing wave resonance condition from the reflection of acoustic surface waves generated by the transducer, thereby resulting in a very high Q electroacoustical resonator. Preferably, the transducer is of the interdigitated type. The grating structures may be formed in various ways, one approach involving the deposition of a plurality of parrallel narrow bars of thin film material which may be either conductive or nonconductive, with the bars being positioned so that surface waves propagating in the piezoelectric material will be incident thereon in a direction transverse to the longitudinal extents of the bars. As a surface wave passes a given one of these bars, a certain proportion of its energy will be reflected. By providing equal spacing between successive bars of these respective grating structures, then at the appropriate frequency the energy reflected from the various bars added coherently. The inclusion of a sufficient number of bars in each grating structure enables substantially total reflection of the incident surface wave to occur. Very precise processing control can be maintained in conjunction with the formation of a grating structure comprising such reflective bars as to spacing, size, and location thereof. Another technique for achieving a grating structure involves the etching of grooves directly into the surface of the piezoelectric material existing either as the substrate or a thin film thereon for which similarly precise processing controls are maintainable. Thus, an acoustic surface wave resonator device with a relatively high Q of the order of at least 1,000 can be fabricated in an economically feasible manner.

In another version of the present invention, a pair of acoustic surface wave transducers are positioned between two spaced grating structures on a piezoelectric substrate or a piezoelectric film disposed on a substrate, wherein one of the transducers is an input transducer and the other is an output transducer. In this arrangement, the output transducer couples electrical energy out of the resonator device which may then serve as a bandpass filter whose frequency selectivity is much sharper than that achievable with other known types of surface wave delay line devices of comparable size. Just as quartz crystal resonators can be used for building multi-pole bandpass filters, these resonators can be used in a similar manner by fabricating several resonator structures adjacent to each other on the same substrate. The several resonators are electrically coupled to each other through the use of interdigital transducers. Yet other forms of the invention include acoustic coupling between input and output acoustic surface wave transducers and other forms of electrical coupling such as multistrip coupling.

It is therefore, an object of this invention to provide highly selective resonator devices in the VHF and UHF bands through the use of at least one acoustic surface wave transducer interposed between spaced apart grating structures.

It is a further object of this invention to provide resonator devices of relatively small size by employing acoustic surface wave devices as components thereof.

It is also an object to provide highly selective resonator devices which permit very precise control over the frequency response characteristic in an economically feasible manner.

It is yet a further object to provide a multi-resonator device employing a plurality of surface wave resonators formed on the same surface wave delay substrate.

Other objects, features and advantages will become apparent from the following detailed description when taken in connection with the appended claims and the accompanying drawings in which:

Figure 1:
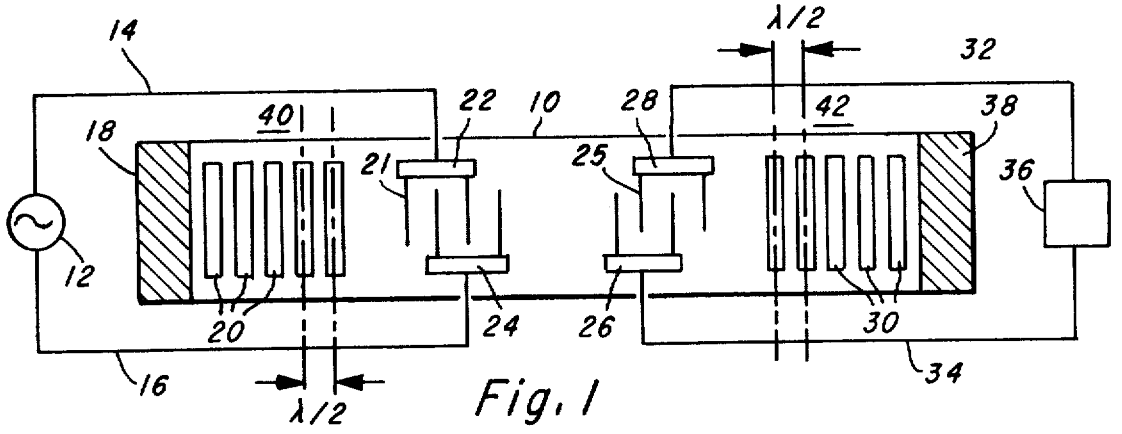
FIG. 1 is a schematic illustration of one embodiment of an acoustic surface wave resonator device constructed in accordance with the present invention.

Referring to FIG. 1, there is illustrated one embodiment of an acoustic surface wave resonator device in accordance with the present invention which may comprise a bandpass filter or oscillator frequency control element. The resonator device comprises a substrate 10 of piezoelectric material such as lithium niobate or quartz. First and second reflective grating structures 40, 42 are provided on the substrate 10, the reflective grating structures 40, 42 comprising respective pluralities of discontinuities 20, 30. The discontinuities 20, 30 are formed at the surface of substrate 10 so as to be capable of reflecting at least a portion of any surface waves incident thereon.

The discontinuities 20 and 30 of the grating structures 40 and 42 may be formed as a plurality of narrow thin film fingers or bars desposited on the surface of substrate 10. The bars may be formed of an electrically conductive material such as gold, copper, or aluminum. Alternatively, they may be formed of a dielectric material such as silicon oxide, silicon nitride, and zinc oxide, for example. Alternatively, the reflecting discontinuities 20 and 30 may be formed by selectively etching portions of the surface of substrate 10. While for purposes of illustration, each of grating structures 40, 42 is illustrated as having five discontinuity elements, it will be understood that many more such elements may be incorporated in the grating structures, 100 being a typical number, to enhance the total percentage of reflection of acoustic surface waves incident to the grating structures 40 and 42.

The grating structures 40 and 42 are arranged on the substrate 10 in spaced apart, aligned relationship. Input and output acoustic surface wave transducers 21 and 25 are disposed on the substrate 10 in the space between the grating structures 40 and 42, the surface wave transducers 21 and 25 preferably being of the interdigital type. To this end, the input interdigital transducer 21 comprises electrodes 22 and 24. The electrodes 22 and 24 may be formed of a suitably patterned thin film electrically conductive material such as gold, copper, aluminum. The electrodes 22 and 24 are illustrated in FIG. 1 as having two fingers each, although it will be understood that the electrodes may have a larger number of fingers. The input interdigital transducer 21 is coupled by means of lines 14 and 16 to an input electrical excitation source 12. The output interdigital transducer 25 comprises electrodes 26 and 28, the electrodes of this transducer being formed in a manner similar to those comprising the input interdigital transducer 21. The output interdigital transducer 25 is coupled to an external load 36 by means of lines 32 and 34. The extremities of substrate 10 may be suitably treated so as to effect the absorption of any surface waves incident thereon, thereby preventing the reflection of surface waves from the extremities of the substrate 10. Such treatment may comprise deposition of an absorptive material at the surface of the substrate 10 in areas at the opposite ends thereof. In this respect, the end portions 18 and 38 of the substrate define respective surface wave abscrption areas.

Operationally, electrical energy provided by input source 12 is converted by the input interdigital transducer 21 to acoustic surface wave energy propagating along the surface of substrate 10. As these propagating surface waves reach the discontinuity elements 20 and 30 of the grating structures 40 and 42 they will be at least partially reflected by each of the discontinuity elements. The individual reflective discontinuities 20, 30 of each of the grating structures 40, 42 are equispaced with the distance between centers of adjacent discontinuities being equal to one-half wave length at the center frequency of the resonator device. As a result, the waves reflected from the various discontinuity elements 20, 30 of the respective grating structures 40, 42 will reinforce in a coherent manner. If a suitable number of reflective discontinuities are provided, almost total reflection of the incident acoustic wave form will occur. The presence of the two reflecting grating structures 40, 42 on the surface of substrate 10 results in a standing wave resonance being set up between the two reflectors with a bandwidth which is controlled by the residual losses in the system. Proper realization of this standing wave resonance requires that the two reflecting grating structures 40, 42 be separated by approximately an integral number of half-wave lengths along the surface of substrate 10. Also in order to most efficiently excite the standing wave resonance, the input interdigital transducer 21 should be located in a particular manner with respect to the locations of the reflective grating structures 40, 42. In the latter connection, the areas of maximum surface wave excitation in the substrate 10 beneath the input interdigital transducer 21 should coincide with maxima in the standing wave pattern. Energy in the standing wave resonance is coupled by means of the output interdigital transducer 25 to the load 36. Just as in the case of the input interdigital transducer 21, the output interdigital transducer 25 should be so located so that its areas of maximum sensitivity coincide with maxima in the standing wave pattern.

Various modifications of the embodiments shown in FIG. 1 may occur to those skilled in the art. Thus, the reflecting grating structures 40 and 42 may be formed as etched grooves in the substrate 10 as has already been discussed, for example. While in the embodiment of FIG. 1. interdigital transducers 21 and 25 have been employed for coupling into and out of the resonator structure, other forms of acoustic surface wave transducers for coupling energy into and out of the resonator structure could also be employed. Also, while both the input and output transducers 21 and 25 have been illustrated as being located in the region of substrate 10 intermediate to the two reflective grating structures 40 and 42, it is possible to locate either or both of the transducers outside of this region. Further, while the structure has been illustrated as having just two reflective grating structures, it is possible to employ more than two reflective grating structures thereby giving rise to one or more regions of standing wave resonance. Surface wave resonator devices fabricated according to the principles of this invention have been found to typically have Q's of 1,000 or higher; up to values above 10,000.

Figure 2:
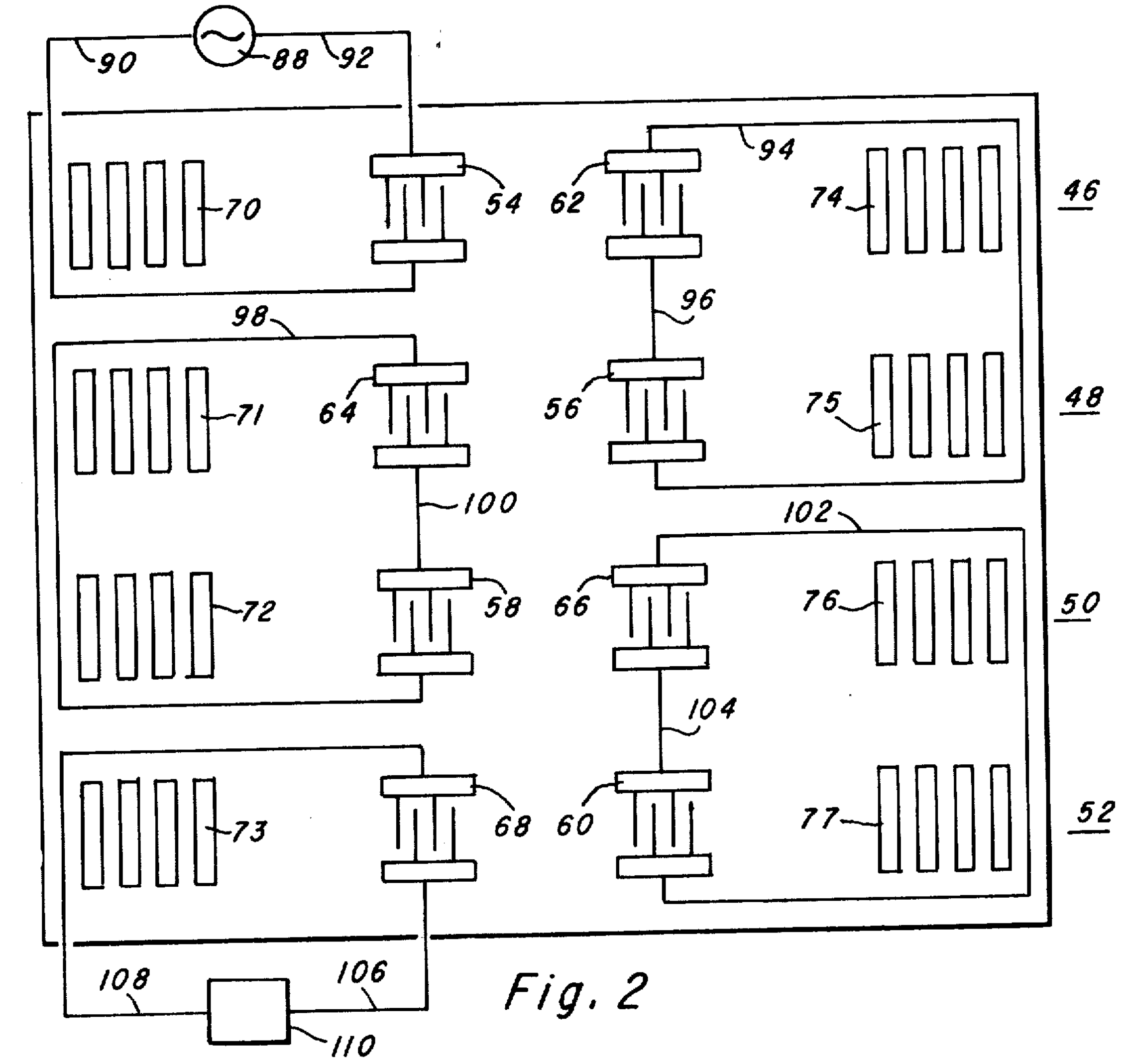
FIG. 2 is a schematic view showing another surface wave multi-resonator structure in accordance with the present invention.

FIG. 2 illustrates diagramatically the combination of several resonator structures of the type discussed above for the purpose of providing a multi-resonator structure. The entire structure is formed on a substrate of piezoelectric material 44 and comprises a plurality of distinct resonator structures 46, 48, 50 and 52. Each of the resonators includes first and second spaced apart grating structures, these grating structures being located at 70–77. In addition, each resonator has an input interdigital transducer, these being located at 54, 56, 58 and 60 along with an output interdigital transducer, these being located at 62, 64, 66 and 68. The input interdigital transducer 54 of the first resonator structure is coupled to an external electrical signal source 88 by means of lines 90 and 92. The output of the first resonator structure appearing at its output interdigital transducer 62 is coupled by means of lines 94 and 96 to the input interdigital transducer 56 of the second resonator structure. Similarly, the output of each succeeding resonator is coupled to the input of the next succeeding resonator. Finally, the output interdigital transducer of the last resonator structure is coupled by means of lines 106 and 108 to an external load 110.

The frequency response of each individual resonator is primarily controlled by the location and number of elements in its reflecting grating structures. Thus, while all of the reflective grating structures in FIG. 2 have been represented as having the same configuration, it may in general be desirable to have slightly different configurations in each of the individual resonators so as to arrive at a desired overall frequency response. Coupling between the individual resonators of the multi-resonator structure is controlled by the design of the respective interdigital transducers using techniques well known in the art. The ability to control the frequency response of the individual resonators and the coupling between resonators allows great flexibility in the realization of a desired overall frequency response.

While a particular embodiment of the multi-resonator structure has been disclosed, modifications of this structure may occur to those skilled in the art similar to the modifications discussed in connection with the embodiment of FIG. 1. It may sometimes be necessary to reduce the amount of acoustic wave cross coupling between adjacent resonators. Means for accomplishing this include but are not limited to the placement of absorptive material on the surface of the substrate between adjacent resonators or the formation of a depression in the substrate several wavelengths deep between adjacent resonators. If desirable, the individual resonators of a given structure may each be fabricated on its own individual substrate. Moreover, while the multi-resonator structure embodiment here for purposes of illustration comprises a cascade connection of individual resonatos, other embodiments of the invention may comprise a parallel or series/parallel connection of the individual resonators.

Figure 3:
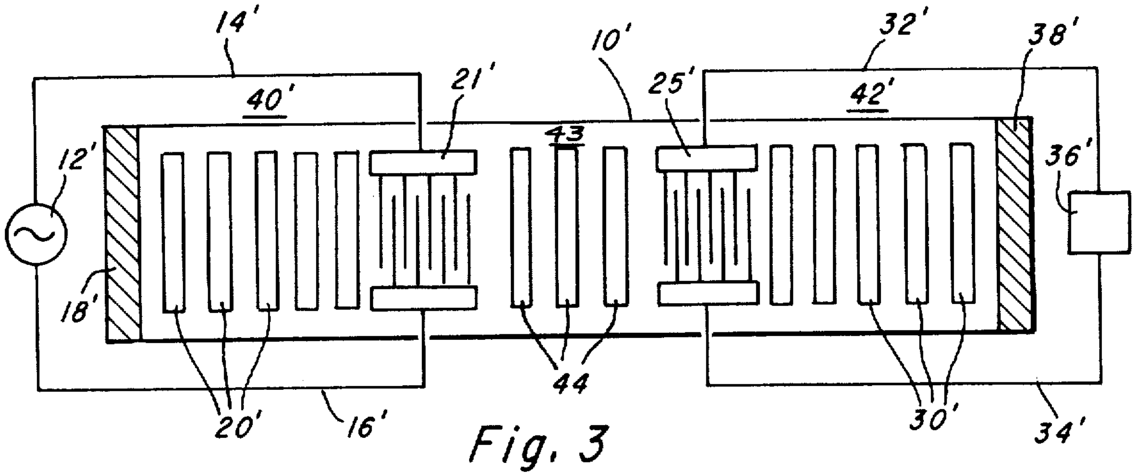
FIG. 3 is a schematic view similar to FIG. 1, but showing an acoustic coupling between the input and output acoustic surface wave transudcers of the resonator device.

Referring to FIG. 3, another embodiment of a resonator device constructed in accordance with the present invention is disclosed in the embodiment of FIG. 3, acoustic coupling means is introduced between the input and output interdigital acoustic surface wave transducerss of the resonator device. The resonator device of FIG. 3 is otherwise identical to the embodiment shown in FIG. 1. Therefore, to avoid repetitious description, corresponding structural elements in FIG. 3 have been designed by the same reference numeral employed in connection with the embodiment of FIG. 1 with the prime notation added. The acoustic coupling means between the input and output interdigital transducers 21', 25' takes the form of a third intermediate reflective grating structure 43 comprising a plurality of discontinuities 44 of the same character of the discontinuities 20', 30' of the first and second grating structures 40', 42' located outwardly on the substrate 10' with respect to the input interdigital transducer 21' and the output interdigital transducer 25', respectively. The discontinuities 44 of the intermediate grating structure 43 are preferably formed in the same manner as the discontinuities 20', 30' of the first and second grating structures 40° , 42'. Thus, the discontinuities 44 of the intermediate grating structure 43 may comprise a plurality of narrow thin film fingers or bars deposited on the surface of the substrate 10' in the space between the input and output interdigital transducers 21', 25'. The fingers or bars 44 may be of electrically conductive material or a dielectric material, suitable materials being as previously described in connection with the discontinuities 20 and 30 of the first and second grating structures 40, 42 of the embodiment of FIG. 1. It will be further understood that the discontinuities 44 of the intermediate grating structure 43 may also be formed by etched grooves in the substrates 10'. The individual reflective discontinuites 44 of the intermediate grating structure 43 comprise an acoustic coupling between the input and the output interdigital transducers 21', 25', the discontinuites 44 being equally spaced with the distance between centers of adjacent discontinuites being substantially equal to one-half wavelength at the center frequency of the resonator device. Improved filter characteristics of the resonator device shown in FIG. 3 may be achieved by the inclusion of the acoustic coupling means in the form of the intermediate grating structure 43 on the substrate 10' between the input and output interdigital transducers 21', 25'. Further in this respect, the input and output interdigital transducers 21', 25' should be particularly located not only with respect to the reflective grating structures 40', 42', but also with respect to the intermediate third grating structure 43 interposed therebetween. To this end, the areas of maximum surface wave excitation in the substrate 10' beneath the input interdigital transducer 21' should coincide with maxima in the standing wave pattern, with the areas of maximum sensitivity in the output interdigital transducer 25' coinciding with maxima in the standing wave pattern. In the form of the invention illustrated in FIG. 3, the grating structures 40' and 43' cooperate with the transducer 21' to form one resonating structure, whereas the grating structures 42' and 43 cooperate with the transducer 25' to define a second resonating structure. The two resonating structures may be constructed to have slightly staggered resonating frequencies to provide the desired response for the complete device or may have identical resonating frequencies in accordance with this invention. Coupling between the two resonating structures is achieved by leakage through the intermediate grating structure 43.

Figure 4:
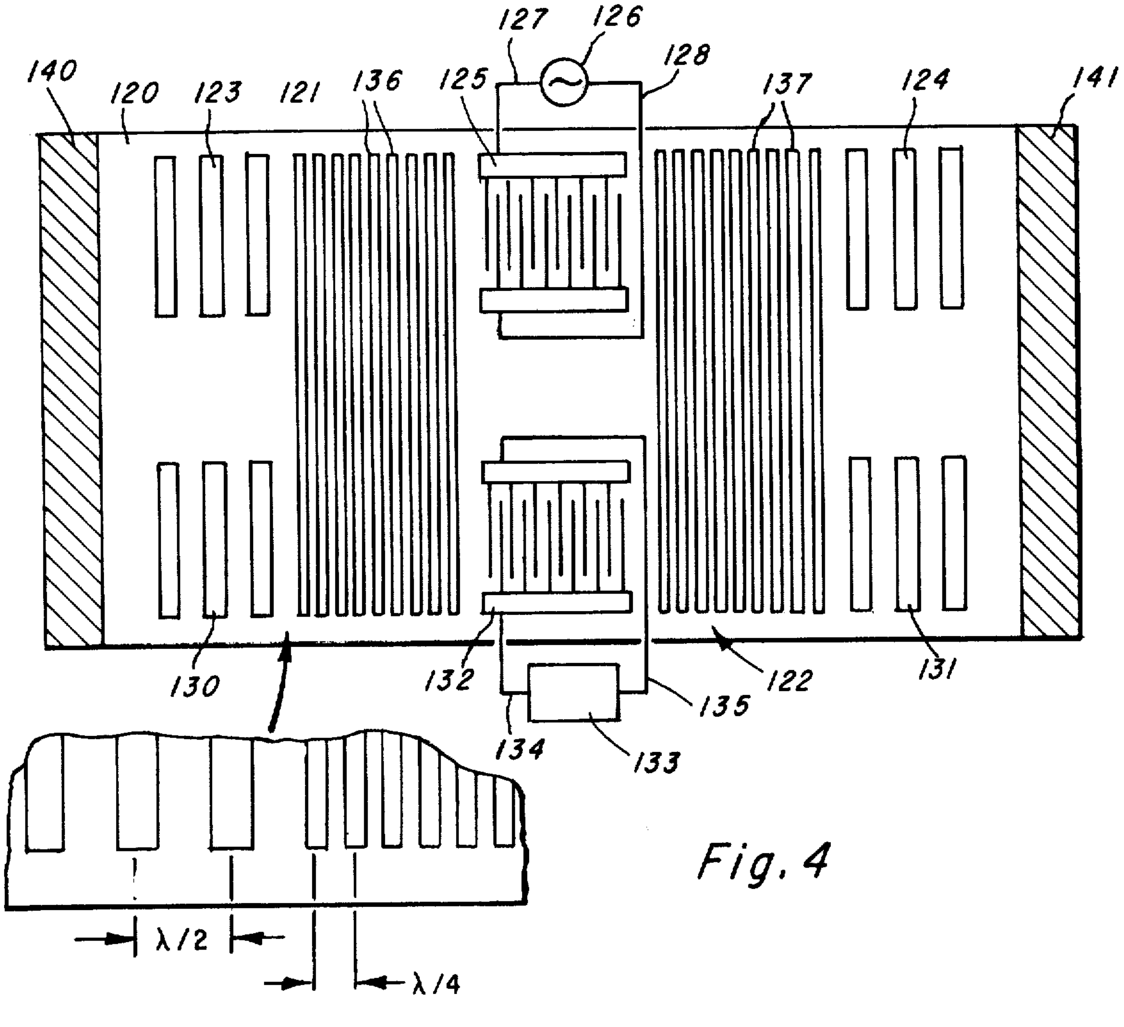
FIG. 4 is a schematic view of another embodiment of the resonator device in which multistrip coupling is employed between input and output sections thereof.

In another embodiment of the invention shown in FIG. 4. an additional form of electrical coupling is provided between input and output sections of a resonator device. In FIG. 4, the resonator device therein illustrated comprises a substrate 120 of suitable piezoelectric material on which are disposed input and output resonator sections 121 and 122, respectively. The input resonator section 121 comprises first and second reflective grating structures 123, 124 disposed in aligned spaced apart relationship on the substrate 120 and being located on opposite sides of an input acoustic surface wave transducer 125. The input transducer 125 is perferably of the interdigital type and is coupled to an external input electrical excitation source 126 by lines 127 and 128. Similarly, the output resonator section 122 comprises first and second reflective grating structures 130, 131 disposed in aligned spaced apart relationship on the substrate 120 and being located on opposite sides of an output acoustic surface wave transducer 132 which is preferably of the interdigital type. The output interdigital transducer 132 is coupled to a load 133 by lines 134, 135. The input and output resonator sections 121 and 122 are coupled together by electrical coupling means in the form of multi-strip couplers 136 and 137 respectively extending between the input and output resonator sections 121 and 122. The multi-strip couplers 136 and 137 are located on opposite sides of the input and output interdigital transducers 125, 132, respectively comprising a plurality of extremely thin parallel metallic strips disposed on the substrate 120. In this connection, each of the elongated metallic strips included in the multi-strip couplings 136 and 137 extends transversely across the width of the substrate 120 so as to include respective portions in contiguous relationship with the input and output interdigital transducers 125 and 132. As compared to the discontinuities of the reflective grating structures 123, 124 and 130, 131 of the input and output resonator sections 121 and 122, the individual metallic strips of the multi-strip couplers 136, 137 are relatively thin and are so arranged that the spacing between centers of adjacent metallic strips is substantially less than one-half wavelength, such as for example one-fourth wavelength, at the center frequency of the resonator device. The discontinuity elements of the grating structures 123, 124 and 130, 131 are of increased thickness as compared to the metallic strips included in the multi-strip couplers 136 and 137, with the distance between centers of the adjacent discontinuity elements being substantially equal to one-half wavelength at the center frequency of the resonator device. The opposite ends of the substrate 120 include respective absorption areas 140, 141 in the manner described with respect to the embodiment of FIG. 1, thereby preventing the reflection of acoustic surface waves from the extremities of the substrate 120.

In operation, the embodiment of FIG. 4 is energized by providing an electrical signal from the input source 126 to the input acoustic surface wave interdigital transducer 125 included in the input resonator section 121. The input transducer 125 thereby generates acoustic surface wave energy propaged along the surface of the substrate 120. The reflection of the propagating surface waves by the discontinuity elements of the grating structures 123, 124 occurs in the manner heretofore described, with the metallic multi-strip couplers 136 and 137 preforming the additional function of a directional coupler for freely propagating acoustic surface waves, both generated and reflected, between the input and output resonator sections 121 and 122. Accordingly, the surface waves reflected from the discontinuity elements of the grating structures 123, 124 are transmitted to the discontinuity elements of the grating structures 130, 131 by the multi-strip couplers 136 and 137 which are so positioned as to set up a standing wave resonance pattern between the input and output resonator sections 121 and 122. The output interdigital transducer 132 of the output resonator section 122 converts the acoustic surface wave energy in the resonator device into electrical energy which is coupled to the load 133 through lines 134, 135.

Figure 5:
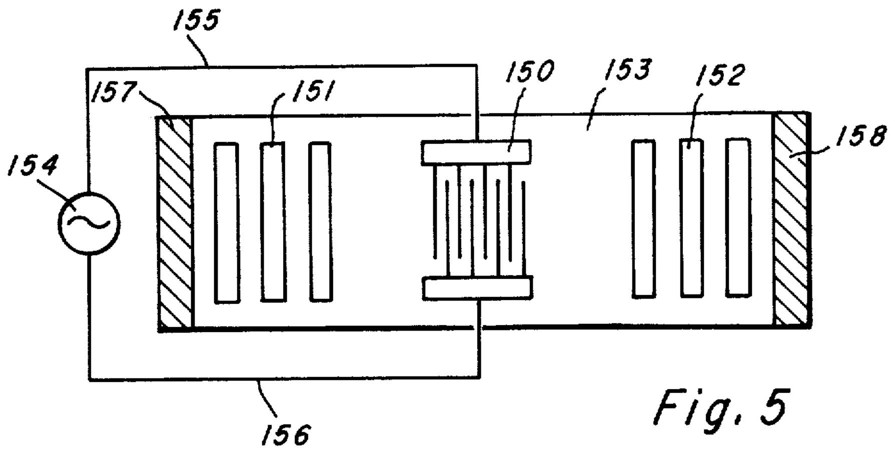
FIG. 5 is a schematic view of another embodiment of the resonator device in which a single acoustic surface wave transducer is interposed between spaced apart grating structures.

FIG. 5 illustrates yet another embodiment of the invention similar to that illustrated in FIG. 1 except that only a single acoustic surface wave transducer 150 is interposed between spaced apart reflective grating structues 151 and 152 on a substrate 153 of suitable piezoelectric material. An external source 154 of an electrical signal is coupled to the surface wave transducer 150 which is preferably of the interdigital type through lines 155, 156. The external source of electrical energy 154 serves as an excitation means for the transducer 150 to generate acoustic surface waxes in the substrate 153 which are then reflected by the plurality of discontinuity elements comprising the reflective grating structures 151 and 152 located on opposite sides of the transducer 150. The substrate 153 is provided with surface wave absorption areas 157, 158 located at the opposite ends thereof to prevent the reflection of surface waves from the extremities of the substrate 153. Successive discontinuity elements included in the grating structures 151, 152 are spaced equally apart with the distance between centers of adjacent discontinuity elements being substantially equal to one-half wavelength at the center frequency of the resonator device. The respective first and second grating structures 151 and 152 are spaced apart by an integral number of half-wavelengths along the surface of the substrate 153, with the transducer 150 being so located with respect thereto as to achieve a standing wave resonance condition. In this form of the invention, the resonator device has application as a high Q tuned impedance element useful for oscillator control or in filter applications.

Figure 6:
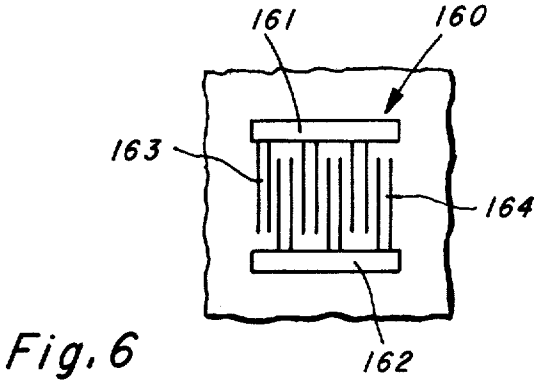
FIG. 6 is a schematic view of an acoustic surface wave transducer of the interdigitated split electrode type which may be alternatively employed as the transducer of the embodiments of FIGS. 1–5

FIG. 6 illustrates an alternate form of acoustic surface wave transducer 160 of the interdigital type, wherein the respective fingers or electrodes are arranged in pairs successively alternating from the oppositely disposed pads 161, 162 of the transducer. Thus, the pad 161 is provided with respective electrode pairs 163, while the pad 162 is provided with respective electrode pairs 164 which are arranged in alternating succession with the electrode pairs 163. This form of interdigital transducer is known as a split electrode type. It is contemplated that the split electrode interdigital transducer 160 of FIG. 6 may be substituted for the transducers included in each of the previously described embodiments of the invention as illustrated in FIGS. 1 – 5. inclusive. Use of the split electrode transducer 160 is effective to substantially reduce or suppress transducer reflections which would otherwise perturb the mode of the resonator device. Thus, the mode of a resonator device including one or more interdigital transducers of the split electrode type illustrated in FIG. 6 is rendered substantially free of perturbation from transducer-generated reflections.

Although the resonator devices in accordance with this invention have been described as being provided on substrates of piezoelectric material, it will be understood that such resonator devices may be formed on a film of piezoelectric material which is deposited on a substrate of non-piezoelectric material. It will be further understood that acoustic coupling between resonator structures may be accomplished by acoustic means other than the reflective intermediate grating structure 43 shown in the embodiment of FIG. 3. For example, it is contemplated that plate modes which normally lead to spurious responses in acoustic surface wave devices could be used in a resonator device structure of the type herein contemplated for the transmission of energy between respective resonator structures in providing sn acoustic coupling therebetween.

In particular, each resonator device as constructed in accordance with the present invention produces a selected resonator frequency as its output wherein the spacing between the adjacent reflectors or discontinuity elements in the reflective grating structures accounts for a shift in the propagation velocity of the surface waves due to the presence of the respective grating structures. In this respect, the spacing between the reflective grating structures on opposite sides of a coupling transducer. such as an interdigital acoustic surface wave transducer, is determined by the formula:

$d = \lambda\ (N/2 - Or/360)$, wherein $d$ = distance or spacing between the reflective grating structures on opposite sides of the coupling transducer;

$\lambda$= wavelength of desired center frequency;

$N$ = an integer; and $\theta R$ = reflection phase angle.

If the integer N is an odd number of wavelengths, the coupling transducer should be provided with an odd number of interdigitated fingers or electrodes, and the coupling transducer should be disposed in a location coinciding with the peak of the standing wave resonance. If N is an odd number of wavelengths, when the coupling transducer is provided with an even number of fingers or electrodes, the position of the transducer with respect to the reflective grating structures on each side of thereof is offset in order to dispose the coupling transducer in a location coinciding with the peak of the standing wave resonance.

While particular embodiments of a resonator device have been disclosed and described, it will be understood that various modifications, changes, substitutions, and alternations may be made therein without deparating from the spirit and scope of the invention which is defined by the appended claims.

What is claimed is:

1. A surface wave resonator device comprising:

substrate means having at least a surface layer of piezoelectric material.

acoustic surface wave transducer means disposed on said piezoelectric surface of said substrate means and being operable to convert an input electrical signal to acoustic surface waves propagating on said piezoelectric surface of said substrate means, and means defining first and second reflective grating structures on the piezoelectric surface of said substrate means on opposite sides of said acoustic surface wave transducer means and being responsive to acoustic surface waves generated thereby to provide at least one region on the piezoelectric surface of said substrate means wherein a standing wave resonance condition occurs.

2. A resonator device as set forth in claim 1. wherein sais substrate means comprises a substrate made entirely of piezoelectric material.

3. a resonator device as set forth in claim 1, wherein said substrate means comprises a substrate body of non-piezoelectric material, and a layer of piezoelectric material provided on said substrate body and forming said surface of piezoelectrical material on which said acoustic surface wave transducer means and said first and second grating structures are disposed.

4. A resonator device as set forth in claim 1, wherein said acoustic surface wave transducer means comprises at least one interdigital transducer.

5. A resonator device as set forth in claim 4, wherein said at least one interdigital transducer includes opposing pads having alternating pairs of electrodes in interidigitated relationship to define a split electrode transducer.

6. A resonator device as set forth in claim 1, wherein said acoustic surface wave transducer means comprises input and output interdigital transducers.

7. A resonator device as set forth in claim 6, further including acoustic coupling means disposed between said input and output interdigital transducers for acoustically coupling the energy being transmitted therebetween.

8. A resonator device as set forth in claim 7, wherein said acoustic coupling means comprises a reflective grating structure having a plurality of discontinuities located at the piezoelectric surface of said substrate means for reflecting at least a portion of the surface wave energy incident thereon.

9. A resonator device as set forth in claim 1, wherein each of said reflective grating structures comprises a plurality of spaced discontinuities located at the piezoelectric surface of said substrate means, each of said discontinuities being capable of reflecting at least a portion of the surface wave energy incident thereon.

10. A resonator device as set forth in claim 9, wherein each of said discontinuities comprises a narrow strip of electrically conductive material located at the piezoelectric surface of said substrate means.

11. A resonator device as set forth in claim 9, wherein each of said discontinuities comprises a narrow strip of dielectric material located at the piezoelectric surface of said substrate means.

12. A resonator device as set forth in claim 9, wherein each of said discontinuities comprises a narrow depression formed in the piezoelectric surface of said substrate means.

13. A resonator device as set forth in claim 1, wherein said reflective grating structures are separated by approximately an integral number of half-wavelengths at the center frequency of said resonator device and wherein each of said grating structures comprises a plurality of spaced discontinuities to the propagation of acoustic surface waves, the spacing between adjacent discontinuities of each of said grating structures being substantially equal to one half-wavelength at said center frequency.

14. A resonator device as set forth in claim 1, further including absorptive means disposed at the opposite ends of the piezoelectric surface of said substrate means for suppressing edge reflections of the acoustic surface waves.

15. A multi-resonator structure comprising a plurality of acoustic surface wave resonators coupled to provide a specified overall frequency response, at least one of said resonators being disposed so as to be directly responsive to an input electrical signal and at least one of said resonators being disposed so as to directly provide an output electrical signal wherein each of said resonators comprises:

substrate means having at least a surface layer of piezoelectric material, an input acoustic surface wave transducer for launching acoustic surface waves on the piezoelectric surface of said substrate means responsive to input electrical energy, means defining first and second reflective grating structures on the piezoelectric surface of said substrate means and being responsive to said acoustic surface waves for providing a standing wave resonance pattern in at least one region of the piezoelectric surface of said substrate means and an output acoustic surface wave transducer responsive to said standing wave resonance pattern for the purpose of providing output electrical energy.

16. A multi-resonator structure as set forth in claim 15, wherein said substrate means comprises a single substrate on which all of said resonators are located.

17. A multi-resonator structure as set forth in claim 16, further including means for reducing the amount of acoustic cross coupling between pairs of said resonators.

18. A surface wave resonator device comprising:

substrate means having at least a surface layer of piezoelectric material.

input and output resonator sections provided on said piezoelectric surface of said substrate means in juxtaposed spaced relationship, each of said input and output resonator sections including an acoustic surface wave transducer and a pair of reflective grating structures including respective pluralities of discontinuity elements disposed in spaced apart aligned relation on opposite sides of said transducer.

said transducer of said input resonator section being responsive to an electrical signal for generating acoustic surface waves in said piezoelectric surface of said substrate means.

electrical coupling means extending between said input and output resonator sections and being so arranged with respect to said pairs of reflective grating structures of said input and output resonator sections to couple acoustic energy therebetween for achieving a standing wave resonance pattern, and and transducer of said output resonator section being responsive to said standing wave resonance pattern for producing an electrical output signal.

19. A resonator device as set forth in claim 18, wherein said electrical coupling means comprises first and second multi-strip couplers, saif first and second multi-strip couplers being respectively disposed on opposite sides of the transducers included in said input and output resonator sections and being located between the reflective grating structures and the opposite sides of said transducers, each of said multi-strip couplers comprising a plurality of elongated metallic strips extending transversely of said piezoelectric surface of said substrate means so as to include respective portions thereof in contiguous relation to said transducers of said input and output resonator sections.

20. A resonator device as set forth in claim 19, wherein the spacing between successive metallic strips included in each of said multi-strip couplings as measured from the centers thereof is substantially equal to one-fourth wavelength of the center frequency of the resonator device, and the spacing between successive discontinuity elements of each of said reflective grating structures is substantially equal ton one-half wavelength at said center frequency.

* * * * *